United States Patent [19]

Trenkler et al.

[11] Patent Number: 5,153,506
[45] Date of Patent: Oct. 6, 1992

[54] APPARATUS FOR MEASURING A WINDING TEMPERATURE OF ELECTRIC MACHINES

[75] Inventors: Gerhard Trenkler, Hamburg-Barsbuettel; Reinhard Wedekind, Hamburg; Reinhard Maier, Herzogenaurach, all of Fed. Rep. of Germany

[73] Assignee: Siemens Aktiengesellschaft, Berlin & Munich, Fed. Rep. of Germany

[21] Appl. No.: 568,830

[22] Filed: Aug. 17, 1990

[30] Foreign Application Priority Data

Aug. 22, 1989 [DE] Fed. Rep. of Germany ....... 3927698
Apr. 25, 1990 [DE] Fed. Rep. of Germany ....... 4013174

[51] Int. Cl.$^5$ .................. G01R 31/02; G01R 31/06
[52] U.S. Cl. .................... 324/158 MG; 324/545
[58] Field of Search ............. 324/158 MG, 110, 545, 324/546; 374/183; 340/648

[56] References Cited

U.S. PATENT DOCUMENTS

| 4,083,001 | 4/1978 | Paice | 324/158 MG |
|---|---|---|---|
| 4,420,721 | 12/1983 | Dorey et al. | 324/110 |
| 4,741,023 | 5/1988 | Lawson | 379/106 |
| 4,829,234 | 5/1989 | Gretsch | 324/62 |
| 4,914,386 | 4/1990 | Zocholl | 324/158 MG |

FOREIGN PATENT DOCUMENTS

| 0301358 | 2/1989 | European Pat. Off. |
| 0927345 | 8/1955 | Fed. Rep. of Germany |
| 1766949 | 9/1971 | Fed. Rep. of Germany |
| 1231721 | 10/1960 | France |

OTHER PUBLICATIONS

Conference Paper of the IEEE Power Engineering Society, 31 Jan.-5 Feb. 1971, pp. 1-8, IEEE, New York, G. S. Hope: "Machine Identification Using Fast Fouerier Transform".

Primary Examiner—Ernest F. Karlsen
Attorney, Agent, or Firm—Kenyon & Kenyon

[57] ABSTRACT

An apparatus for measuring the winding temperature of electric machines uses an a.c. reference voltage source generating an a.c. reference voltage with a predetermined, non-line frequency, preferably below 10 Hz., a current detector detecting the current generated from the a.c. reference voltage and/or the a.c. reference voltage directly, and a measuring and evaluating device measuring the current to determine the winding temperature. The a.c. reference voltage is added geometrically to the line voltage and generates a current proportional to the winding conductance which is temperature dependent.

18 Claims, 1 Drawing Sheet

APPARATUS FOR MEASURING A WINDING TEMPERATURE OF ELECTRIC MACHINES

BACKGROUND OF THE INVENTION

The present invention relates generally to an apparatus for measuring the winding temperature of electric machines, and more particularly to apparatus for measuring the winding temperature by using an a.c. reference voltage source, a current detector and a measuring and evaluating device.

An apparatus which uses one or more sensors in the machine to measure temperature is disclosed in G. Müller, "Elektrische Maschinen" [Electric Machines], Verlag Technik, Berlin 1974. Furthermore, apparatus which have a reference voltage source and a current generated by the reference voltage, whereby a direct measurement of resistance is performed using d.c. current are disclosed in IEC Publication 279, "Measurement of the Winding Resistance of an a.c. Machine During Operation at Alternating Voltage," Geneva, 1969. The former disclosed apparatus require temperature sensors and the requisite supply lines, i.e., increased equipment. The latter disclosed apparatus can deliver erroneous measurements. D.C. voltage potentials on the mains, caused for example, by concurrently operating frequency converters or by thermoelectromotive forces caused by soldered junctions, welded points or clamping points in the mains, which have different temperatures, can greatly falsify the measurement. The possibility of blocking d.c. voltage potentials from the mains by means of capacitors is only useful in small machines. In large machines, the cost and space requirements for the capacitors are disproportionately great.

A method is also disclosed in E & I, Anno 105, Issue 7/8, pp 315 to 318, which makes possible a measurement of the rotor temperature of squirrel-cage induction machines without using thermal sensors. In this case, the rotor temperature is calculated from the variation of the voltage across terminals after switching off a machine that operating without a load and from the time constants of the rotor.

The present invention is directed to the problem of further developing an apparatus for measuring the winding temperature across the line feed of an operating electric machine while dispensing with the additional sensors, and the capacitors which are connected in series to the machine, through which the entire power received by the machine would have to flow.

SUMMARY OF THE INVENTION

The present invention solves this problem by connecting an a.c. reference voltage generating one or more a.c. reference voltages in series with one or more phases of the mains which supply the electric machine such that one or more predetermined, non-line frequency, voltage components are added to the line voltage. This generates a current with the predetermined frequencies that pass through the winding of the machine. The current is detected by a current detector and then measured by a measuring and evaluating device. By knowing the voltage and measuring the current the conductance of the winding can be calculated, which then leads to a determination of its temperature, since the winding conductance is temperature dependent.

The present invention is capable of detecting the actual winding conductance while the machine is operating. In the case of known temperature coefficients of the winding material (generally copper: 0.004 1/K) and in the case of a known resistance at a reference temperature, the actual, average winding temperature can be derived from this variable. This winding temperature is an important parameter for operating a machine, since the permissible maximum temperature should not be exceeded for long period of time for reasons of machine longevity, yet for reasons of economy, operation should take place at the margin of the nominal values.

It has proved particularly advantageous when the frequencies of the current are below 10 Hz. By properly selecting the amplitude of the a.c. reference voltage regarding the additional heating caused by the a.c. reference voltage in relation to the permissable machine temperature, one can avoid damaging influences on the machine temperature. In the case of the present invention, it is advantageous if the amplitude amounts to 1-2% of the amplitude of the a.c. supply voltage.

If the a.c. reference voltage source is designed as a voltage generator supplying a resonance transformer, then the voltage from the generator can be decoupled from the mains.

If the a.c. reference voltage source is designed as a voltage generator supplying a broadband transformer, then the voltage from the generator can again be decoupled from the mains. However, the capacitor, which is required for the resonance voltage transformer, is no longer necessary, and the available bandwidth for the a.c. reference signal becomes relatively large.

If the a.c. reference voltage source is integrated in a pulse-controlled a.c. converter that is modulated with an additional signal having the predetermined frequency, then the transformer can be dispensed with so that the lower frequency can be freely selected.

If the a.c. reference voltage source is designed as a d.c. voltage source which is modulated by the predetermined frequency, then again, a transformer is not required and the lower frequency limit can be freely selected. This design is preferred when a pulse-controlled a.c. converter is not present.

If the a.c. reference voltage source is designed as a mains voltage modulator, then the a.c. reference signal can be derived directly from the supplying main. For this purpose, apparatus consisting of controlled equivalent conductances or susceptances as well as switches can be used as are disclosed in "Modualtionsverfahren in der Nachrichtentechnik" [Modulating Methods in Telecommunications], R. Mäusl, UTB Hüthig Verlag, Heidelberg, 1976, Chapter 1.3, pp. 35-55, the disclosure of which is hereby incorporated by reference. Since in this case the current and voltage are simultaneously influenced, it is necessary to measure both variables as well as to form their quotients in order to calculate the temperature.

If a.c. reference signals consisting of at least three different frequency ranges, which are evaluated separately, are generated by the mains voltage modulator, then the use of signals with multiple frequencies, such as noise, is possible.

In addition to the indicated possible designs for the a.c. reference voltage source, the simultaneous evaluation of a.c. reference signals of different frequencies or frequency ranges has proved advantageous for a distinct possibility of identifying deterministic interferences. Since these interferences are narrow-banded and have known frequency differentials, they can be identified by simply comparing the amplitudes of several a.c.

reference signals of different frequencies. For example, if two of at least three a.c. reference signals are the same and are therefore able to be evaluated within the limits of measuring uncertainty, the third can be discarded.

The are also several possible designs for the specific embodiment of the current detector. If the current detector is designed as a resonance transformer, then in addition to the voltaic separation from the mains, the line-frequency signals are effectively damped. However, an additional capacitor is required. If the current detector is designed as a broadband transformer, then also, as in the case of the resonance transformer, there is a voltaic separation from the mains. The capacitor in this case is superfluous and the available bandwidth becomes large.

The most economical possibility of detecting the current signal occurs when the current detector is designed as a shunt. In this case, the current transformer can be dispensed with; however, the voltaic separation must also be dispensed with.

A simple design for the measuring and evaluating device is by means of selective amplitude measurements.

If the measuring and evaluating device is designed as a spectral analytical device, preferably one using the Fast-Fourier transformation, parasitic frequencies can be identified and the frequency resolution can be high.

If the measuring and evaluating device is designed as a synchronous demodulator which is controlled by the a.c. reference voltage source, then selectivity and noise reduction are attainable with regard to stochastic noise.

If the a.c. reference voltage source is modulated by means of a generator with a band spreading function, and the broadband a.c. reference signal is supplied to a synchronous modulator functioning as the current detector, then a reduction of noise is attainable with regard to deterministic interferences.

Additional machine errors can be identified without much further effort when the a.c. reference voltage source and the current detector are designed as several devices present in each phase in the polyphase mains, to which devices for monitoring the symmetry of the signals are connected in order to identify a short circuit to a winding and/or an exposed conductive part.

With a little more effort, the rotary speed of the machine can also be detected if a device is switched onto the a.c. reference voltage source. The device derives a signal which is proportional to the rotary speed of the machine from an a.c. voltage which is fed into an induction machine, which can appear on the terminals of the machine as a voltage and/or current signal.

DETAILED DESCRIPTION

Before describing the possible designs at the operating levels, the following describes the common principle in light of the example of an electric induction machine. From viewing the known equivalent circuit diagram of this machine (T. Bödefeld, H. Sequenz: "Electric Machines" Springer Verlag 1949, 4th edition, p. 159, the disclosure of which is hereby incorporated by reference), one can see that only at the frequency zero can the stator resistance be measured precisely. At line frequency, there is a real component of input impedance which has a great dependence on rotor resistance and on slip, i.e. on the load of the machine. However, there is the possibility of undertaking the measurement at frequencies which are so low that scatter effects and transformations of the rotor side can be virtually negligible in the stator circuit.

The upper frequency limit at which a nearly load-free measurement is possible depends on the type of machine. It lies advantageously in the range below 10 Hz.

Figure 1:
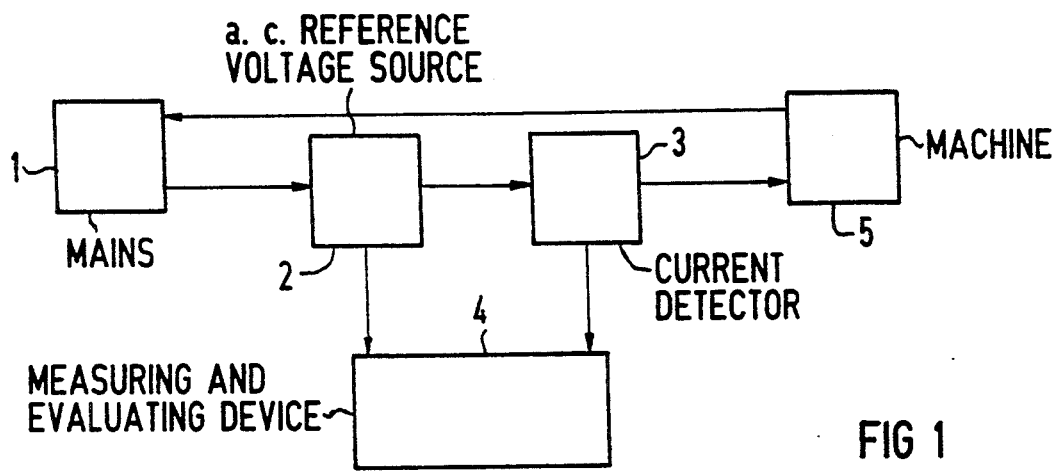
FIG. 1 is a block diagram of the general structure of a one phase design.

In the embodiment according to FIG. 1, a suitable a.c. reference voltage source 2 is connected in series to the mains 1 supplying the machine 5 such that this predetermined, non-line, low frequency voltage is added geometrically to the line voltage and a current of this frequency is driven through the winding of the machine 5 and the mains 1. This current is detected by a current detector 3 and is supplied to a measuring and evaluating device 4. The amplitude of the a.c. reference voltage is to be selected such that no significant additional heating of the machine 5 takes place, i.e., for example, the amplitude of the a.c. reference voltage does not exceed 1-2% of the line voltage. In the case of rotating electric machines, no interfering instants arise. In the case of a predetermined, constant a.c. reference voltage, the current is in proportion to the conductance to be measured and can be directly evaluated. If the demand for a constant a.c. reference voltage is not satisfied, then this voltage shall also be measured. By forming the quotient by means of analog or digital modules, the conductance or the resistance can then be determined. These types of modules are known e.g. from Tietze, Schenk, "Halbleiterschaltungstechnik" [Semiconductor Switch Engineering], Springer Verlag Berlin, 1986, 8th edition, Page 344, the disclosure of which is hereby incorporated by reference. The aforementioned resistance is the series connection of the winding and the mains resistance. The latter can be ignored, however, if it is less than the winding resistance by some orders of magnitude. This requirement is satisfied in customary mains. If the mains resistance is to be included in the measurement in order to increase accuracy, then it is to be measured and taken into account in the evaluation by means of simple subtraction, since it is constant in practice.

Several possible designs are given for the circuits of blocks 2, 3, and 4 which are shown in FIG. 1. The sophistication and power vary so that a combination can be selected which is best adapted to the measuring task.

Possible designs for are:

1. Design with a resonant voltage transformer

The a.c. reference voltage source 2, has, e.g., a simple function generator feeding the primary of a resonance transformer, i.e., a transformer which is operated by means of a capacitor preferably in series resonance, and the secondary of the resonance transformer is coupled to the mains 1 supplying the machine 5. In this manner, line-frequency reactions to the function generator are effectively avoided. The demands on the function generator are few; its source resistance should not considerably impair the quality of the resonant circuit. The decoupling of the generator voltage form the mains 1 is advantageous.

The resonance transformer is to be adjusted to the stable a.c. reference frequency which must lie safely above its lower frequency limit which is determined by the transformer. The demands on the frequency stability are high, since otherwise amplitude errors and phase faults can appear.

2. Design with a broad band voltage transformer

Here, too, the decoupling of the generator voltage from the mains 1 is advantageous. A capacitor is unnecessary. The available bandwidth for the a.c. reference signal is large. The source resistance of the feeding generator must be very low and the transmission ratio of the transformer is not permitted to be too low, since otherwise the line-frequency voltages which are transferred to the generator side do not drop sufficiently at the source resistance of the generator and can endanger it.

3. The use of a pulse-controlled a.c. converter

If the electric machine 5 is supplied by a pulse-controlled a.c. converter, then the existing modulator can be used to generate the desired a.c. reference voltage by additionally modulating it with the desired a.c. reference frequency. Thus, no transformer is required; the lower frequency limit can be selected freely.

However, care must be taken that in particular in the case of low operating frequencies, possible interference voltages are present in the frequency range of the a.c. reference voltage. In this case, a sufficient signal to noise ratio is to be ensured. Possibilities for this purpose are indicated in the following description of the measuring and evaluating device 4.

4. Design as a modulated d.c. voltage source 8

Figure 2:
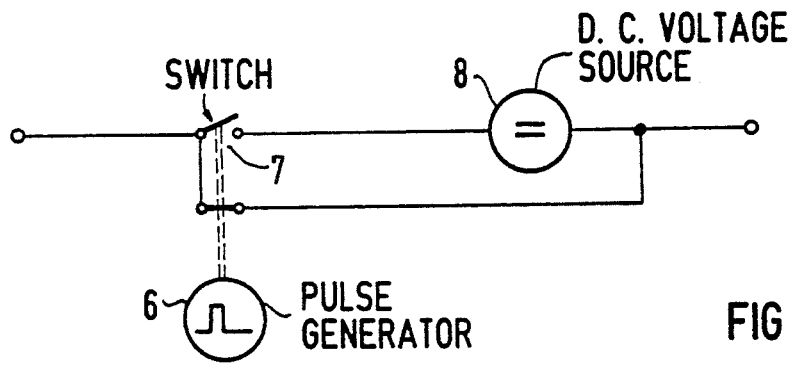
FIG. 2 is a principle design of the a.c. reference voltage source.

In FIG. 2 a principle design regarding this is shown. A switch 7 is controlled by a pulse generator 6 and switches the d.c. voltage source 8 temporarily in series to the mains 1. The switch 7 is preferably a known configuration of semiconductor switches. The pulse generator 6 actuates this switch 7 at the a.c. reference frequency. In this manner, a modulation of the d.c. voltage which is delivered by the d.c. voltage source 8 takes place with the a.c. reference frequency and simultaneously an addition of the product of modulation to the line voltage takes place. The effective value of the a.c. reference voltage can be determined by way of the d.c. voltage and/or by way of the pulse width of the control signal of the pulse generator 6. In the output of the d.c. voltage source 8 there is usually a filter capacitor present which is temporarily connected in series to the machine 5 and to the mains 1 for the duration of the pulse. Current, and thus only a negligible part of the machine power, flows through it only for the duration of the control signal of the pulse generator 6. By appropriately selecting the control times, the effort for this capacitor can be minimized. The lower frequency limit of the a.c. reference signal is also able to be freely selected in the case of this configuration. However, when semiconductor switches are used for the switch 7, there is no decoupling of the voltage from the mains 1. Also, the d.c. voltage source 8 lies at the mains potential. It is therefore necessary to design the supply lines for the pulse generator 6 and the d.c. voltage source 8 such that the requisite electrical isolation is guaranteed.

The current detector 3 which is used in FIG. 1 can be designed as a resonant current transformer. For this purpose, a current transformer is operated in parallel resonance at the stable a.c. reference frequency by means of a capacitor. Therefore, the line-frequency signals in its output signal are effectively damped so that the further processing is simplified. Of further advantage is the separation of the voltage from the mains 1. The a.c. reference frequency must lie safely above the lower frequency limit of the transformer; the demands on frequency stability are great, since otherwise amplitude errors and phase faults can appear.

In a design for the current detector 3 as a broadband current transformer, a simple current transformer is used whose lower frequency limit lies below the a.c. reference frequency. In this case, a capacitor can be dispensed with. The available bandwidth becomes large. Of further advantage is the voltaic separation of the output signal from the mains potential. Line-frequency output signals must be sufficiently damped in the measuring and evaluating device 4 by means of conventional low pass filters.

The most economical possibility of a design for the current detector 3 is by using a simple shunt. A current transformer can be dispensed with; there is no lower frequency limit. The shunt is included in the measuring result. Therefore, it must be dimensioned such that its influence is negligible. In case this is not possible, it can be taken into account in the evaluation by means of a simple subtraction since its value is known. A voltaic separation from the mains potential is not present in this design.

As a design for the measuring and evaluating device 4 there are e.g. the following possibilities:

1. Selective Amplitude Measuring

The a.c. reference voltage and/or reference current is derived by means of selective filters which are adjusted to the a.c. reference frequency and are supplied to a known averaging unit. The average is calculated in the customary manner, and, as described above, is converted into the winding temperature. For this simple configuration, a sufficient signal to noise ratio between the useful and interference signals is necessary. It can be improved by the high quality of the selective filter and/or great time constants of the averaging unit. The rate of detection of temperature changes increases in this case.

2. Spectral Analysis

The a.c. reference voltage and/or the reference current are evaluated with a conventional spectrum analyzer. Parasitic frequencies can be identified and the frequency resolution can be very high, if needed. Known analog analyzers or preferably digital Fast-Fourier transform analyzers can be used.

3. Synchronous Demodulation

The frequency and phase of the supplied voltage are given: therefore, there is the possibility of measuring the current signal by means of synchronous power rectification. With this method, selectivity and noise reduction are attainable with regard to stochastic interferences. Synchronous demodulations are known e.g. from Tietze, Schenk, "Halbleiterschaltungstechnik" [Semiconductor Switch Engineering], Springer Verlag, Berlin, 1986, 8th edition, page 797 fol, the disclosure of which is hereby incorporated by reference.

4. Band Spreading

If broadband transformers are used, then the voltage source can be modulated by a suitable band spreading operation. For example, modulating rapid changes in frequency or phases can be considered as modulating methods. The modulated signal is used as an a.c. reference to the synchronous demodulation of the current signal. With this type of a configuration, a reduction of noise is attainable with regard to deterministic interferences. These types of methods are known from Baier, Grünberger, Pandit, "Störunterdrückende Funkübertragungstechnik" [Noise Suppressing Radio Transmission Technology], R. Oldenburg Verlag, Munich, 1984, Page 90 fol, the disclosure of which is hereby incorporated by reference.

If voltage feeding and current measuring are performed in each phase in polyphase mains, then addition information on the operating condition of the electric machine 5 can be derived by monitoring the symmetry of the signals. Interferences which appear during operation, e.g. short circuits to the winding and/or an exposed conductive part, can be detected in this manner.

In the configuration according to the invention, moreover, frequency components can be generated which are based on the modulation of the a.c. reference voltage. Since they are in proportion to rotary speed, they can be used to measure rotary speed. By appropriately selecting the frequency of the a.c. reference voltage, the products of modulation can be converted into a noise-free frequency range so that a simple evaluation is possible.

Figure 3:
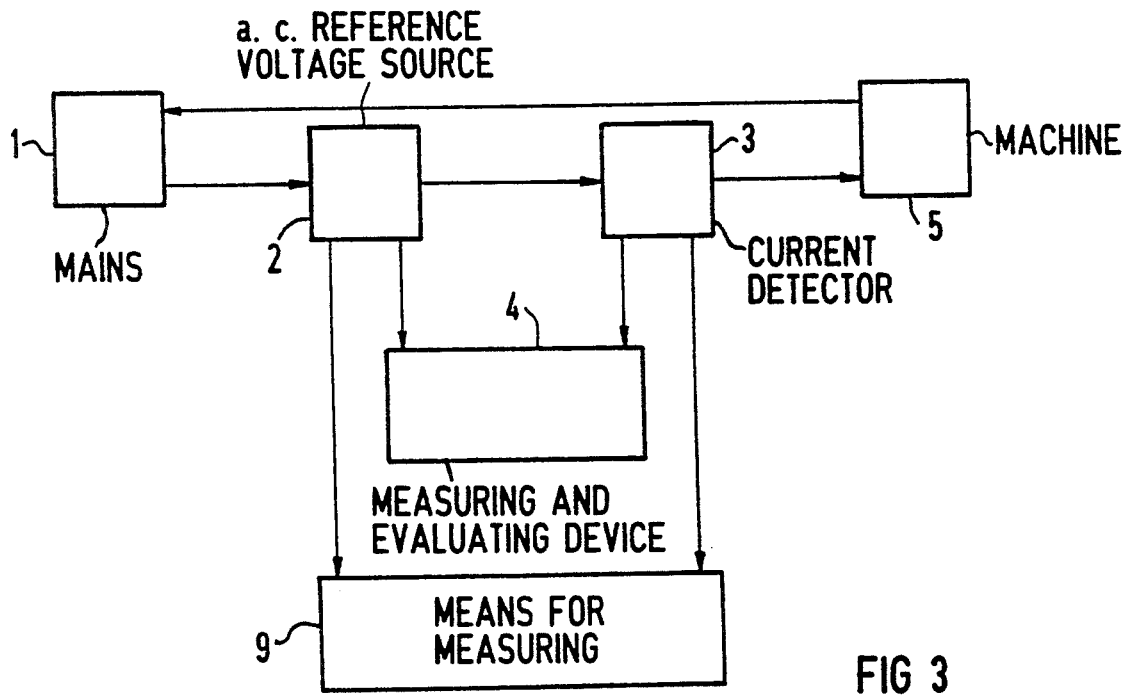
FIG. 3 is a block diagram of the general structure of a one phase design having an additional device for measuring rotary speed.

In the embodiment according to FIG. 3, an a.c. reference voltage source 2 is connected in series to the mains 1 supplying the machine 5. The a.c. reference voltage source 2 can be switched to deliver an additional non-line frequency voltage which is advantageously different from the temperature a.c. reference frequency. The current detector 3 delivers a current- and/or voltage signal in which frequency components are contained which are in proportion to the rotary speed. The a.c. reference voltage source 2 and the current detector 3 are not to be designed as resonance transformers in the case of differing a.c. reference frequencies. Modules for the measuring means 9 are known.

Methods and configurations for detecting the rotary speed of electric induction machines have already been proposed (P 37 11 976.1; P 37 34 071.9 the disclosure of which is hereby incorporated by reference), which evaluate frequency components which are proportional to rotary speed and are able to be represented by a current and/or voltage. These methods evaluate the resulting signals from modulating the line-frequency which depend on rotary speed.

What is claimed is:

1. An apparatus for measuring a winding temperature of an electric machine fed by mains with at least one phase, comprising:
   a) an a.c. reference voltage source coupled in series with the mains, supplying the electric machine with an a.c. reference voltage having a predetermined, non-line frequency, causing a current having said predetermined frequency to flow through the winding of the machine, wherein said predetermined frequency is less than 10 Hertz and said a.c. reference voltage is between 1-2 percent of a line voltage of the electric machine, whereby any additional heating caused by said a.c. reference voltage is negligible relative to heating caused by the line voltage and to a permissible machine temperature; and
   b) a current detector providing an output proportional to said current from which the conductance of the winding and the winding temperature can be determined.

2. The apparatus of claim 1 wherein the mains have a plurality of phases, further comprising a plurality of a.c. reference voltage sources supplying the machine with a plurality of a.c. reference voltages having a predetermined non-line frequency, whereby a plurality of currents having said predetermined non-line frequency flow through the winding of the machine.

3. The apparatus according to claim 1, wherein said a.c. reference voltage source comprises a function generator generating said a.c. reference voltaqe and a resonance transformer having a primary and a secondary, a voltage source coupled to the primary of said resonance transformer, and the secondary of said transformer coupled in series with the mains supplying said machine.

4. The apparatus according to claim 1, wherein said a.c. reference voltage source comprises a voltage source and a broad band transformer, said voltage source supplying said broadband transformer which provides said a.c. reference voltage to the machine.

5. The apparatus according to claim 1 wherein said machine is fed by a pulse-controlled a.c. converter and said pulse controlled a.c. converter comprises said a.c. reference voltage source modulated with an additional signal having said predetermined frequency.

6. The apparatus according to claim 1, wherein said a.c. reference voltage source comprises a d.c. voltage source with a switch for coupling said d.c. source in series with the mains and a pulse generator operating said switch at said predetermined frequency.

7. The apparatus according to claim 1, wherein said a.c. reference voltage source comprises a mains voltage modulator.

8. The apparatus according to claim 7, wherein said mains voltage modulator generates said a.c. reference voltage in at least three different predetermined frequency ranges which are evaluated separately.

9. The apparatus according to claim 1, wherein said current detector comprises a resonance transformer.

10. The apparatus according to claim 1, wherein said current detector comprises a broadband transformer.

11. The apparatus according to claim 1, wherein said current detector comprises a shunt.

12. The apparatus according to claim 1, further comprising a measuring and evaluating device having an input coupled to the output of said current detector.

13. The apparatus according to claim 12, wherein said measuring and evaluating device comprises a plurality of selective filters coupled to an input of an averaging unit calculating an average current.

14. The apparatus according to claim 12, wherein said measuring and evaluating device comprises a spectrum analyzer.

15. The apparatus according to claim 12, wherein said measuring and evaluating device comprises a synchronous power rectifier demodulating said current.

16. The apparatus according to claim 12, wherein said a.c. reference voltage source comprises a band spreading function generator modulating said a.c. reference voltage, and said measuring and evaluating device comprises a synchronous demodulator demodulating said current.

17. The apparatus according to claim 1, wherein said mains have a plurality of phases, a plurality of a.c. reference voltage sources supplying a.c. reference voltages to the mains and a plurality of current detectors, one for each phase and further including means for monitoring the symmetry of said currents in order to detect a short circuit in the winding or an exposed conductive part.

18. The apparatus according to claim 1, wherein said machine is an induction machine and said a.c. reference voltage source includes a further a.c. reference voltage source from which a speed signal can be derived and further including means to switch said further a.c. reference voltage source into said mains and means for measuring to detect the rotary speed of said machine having said further a.c. reference voltage and the output of said current detector as inputs.

* * * * *